United States Patent [19]
Kodama et al.

[11] Patent Number: 5,296,088
[45] Date of Patent: Mar. 22, 1994

[54] COMPOUND SEMICONDUCTOR CRYSTAL GROWING METHOD

[75] Inventors: Kunihiko Kodama, Takarazuka; Nobuyuki Ohtsuka, Kawasaki; Masashi Ozeki, Kawasaki; Yoshiki Sakuma, Kawasaki, all of Japan

[73] Assignee: Fujitsu Limited, Kawasaki, Japan

[21] Appl. No.: 924,483

[22] Filed: Aug. 4, 1992

[30] Foreign Application Priority Data

Aug. 8, 1991 [JP] Japan .................. 3-198180

[51] Int. Cl.$^5$ .......................... H01L 21/203
[52] U.S. Cl. .......................... 156/613; 437/81; 437/107; 437/133; 437/141; 148/DIG. 57
[58] Field of Search ............ 156/613; 148/DIG. 57; 437/81, 133, 105, 107, 141

[56] References Cited

U.S. PATENT DOCUMENTS 4,975,388  12/1990  Guedon et al. .................. 437/81

OTHER PUBLICATIONS

Hans Luth "Understanding of Surface Chemistry of III-V MOCVD Reactants", Jr. Vac. Sci & Tech (A), vol. 7 (1989), 696–700.

Primary Examiner—Olik Chaudhuri
Assistant Examiner—Ramamohan Rao Paladugu
Attorney, Agent, or Firm—Staas & Halsey

[57] ABSTRACT

A compound semiconductor crystal growing method includes the steps of (a) setting a substrate having a substrate surface in a reaction chamber, and (b) supplying a material gas of a compound semiconductor which is to be grown in the form of a crystal on the substrate surface within the reaction chamber and a control gas to the reaction chamber under a predetermined condition, and controlling the supply of the control gas to control an adsorption rate of the material gas on the substrate surface. The control gas makes competitive adsorption with the material gas on the substrate surface but makes no chemical reaction such that no continual accumulation on the substrate surface occurs under the predetermined condition. The competitive adsorption is defined as a phenomenon in which the material gas and the control gas compete and become adsorped on the substrate surface.

15 Claims, 7 Drawing Sheets

COMPOUND SEMICONDUCTOR CRYSTAL GROWING METHOD

BACKGROUND OF THE INVENTION

The present invention generally relates to compound semiconductor crystal growing methods, and more particularly to a compound semiconductor growing method which controls adsorption of a very small amount of material gas on a substrate surface.

Recently, active research and development are made in respect of various kinds of semiconductor devices, and there are many kinds of semiconductor crystals used in such semiconductor devices. Compound semiconductor crystals and their mixed crystals are essential to the semiconductor devices having various kinds of functions. Accordingly, the growth speed, the crystal composition, the impurity concentration and the like are very important control factors when growing the compound semiconductor crystals.

Conventionally, when growing a crystal layer of a compound semiconductor using a chemical vapor deposition(CVD), the growth speed, the crystal composition and the impurity concentration are controlled by controlling the mole fraction of the material gas which is supplied to a reaction chamber. More particularly, the flow rate of the material gas is controlled by use of a mass flow controller.

However, the accuracy of the mass flow controller is extremely poor if the flow rate is only on the order of several sccm. As a result, there was a problem in that an accurate impurity concentration cannot be obtained if the doping is made with a very small amount of impurity.

In addition, because of the poor accuracy of the mass flow controller, there were problems in that the reproducibility of the process is poor and that it is impossible to arbitrarily control the growth speed, the crystal composition and the impurity concentration.

Accordingly, it is conceivable to use a diluted gas in order to suppress the undesirable effects caused by the poor accuracy of the mass flow controller. For example, when supplying 1 sccm of material gas, a mixed gas made up of 10 sccm of the material gas and 490 sccm of diluting gas such as hydrogen is first obtained, and 1/10 of this mixed gas is then supplied to the reaction chamber so as to substantially supply 1 sccm of the material gas to the reaction chamber. In this case, the mass flow controller can measure 10 sccm of the material gas with a relatively high accuracy. For this reason, even if the doping is to be made with a very small amount of impurity, it is possible to obtain a relatively accurate impurity concentration when compared to the conventional method.

But this conceivable method which uses the diluted gas must first generate the mixed gas and then supply a part of the mixed gas to the reaction chamber. Consequently, there are problems in that the control of the apparatus becomes complicated, the apparatus becomes large and the apparatus becomes expensive.

On the other hand, according to the conventional method and the conceivable method which uses the diluted gas, the impurity concentration is controlled by controlling the supply of the doping (material) gas. Thus, when forming a multi-layered structure having different impurity concentrations, it is necessary to once interrupt the growing process at the layer boundary and reset the amount of doping gas to be supplied. However, the doping gas in general has a strong toxic character, and the doping gas must be handled with extreme care. For this reason, as a safety measure, it is desirable to minimize the operations involving the doping gas, such as interrupting the supply of the doping gas and resetting the supply quantity of the doping gas.

Furthermore, if the doping is made by the conventional method to an extremely high impurity concentration, the composition of the doped layer slightly changes. But conventionally, there was no method of preventing such a change in composition caused by the doping to the high impurity concentration.

SUMMARY OF THE INVENTION

Accordingly, it is a general object of the present invention to provide a novel and useful compound semiconductor crystal growing method in which the problems described above are eliminated.

Another and more specific object of the present invention is to provide a compound semiconductor crystal growing method comprising the steps of (a) setting a substrate having a substrate surface in a reaction chamber, and (b) supplying a material gas of a compound semiconductor which is to be grown in the form of a crystal on the substrate surface within the reaction chamber and a control gas to the reaction chamber under a predetermined condition, and controlling the supply of the control gas to control an adsorption rate of the material gas on the substrate surface, where the control gas makes competitive adsorption with the material gas on the substrate surface but makes no chemical reaction such that no continual accumulation on the substrate surface occurs under the predetermined condition, and the competitive adsorption is defined as a phenomenon in which the material gas and the control gas compete and become adsorped on the substrate surface. According to the compound semiconductor crystal growing method of the present invention, it is possible to finely and accurately control the composition, impurity concentration and growth speed of the compound semiconductor crystal by simply changing the supply condition of the control gas, without the need to change the supply condition of the material gas. For this reason, a relatively inexpensive apparatus having a simple construction may be used for growing the compound semiconductor crystal, and there is no need to make a complicated control of the apparatus. As a result, the present invention greatly improves the fine crystal growth of compound semiconductor mixed crystals and production of structures such as the multi-layered hetero structure and the multi quantum well structure.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention.

In a compound semiconductor crystal growing method according to the present invention, a material gas of a compound semiconductor which is to be crystally grown, and a control gas which makes competitive adsorption with the material gas and does not undergo chemical reaction under a predetermined growth condition, are supplied to a substrate surface under the predetermined growth condition, so as to control the adsorption rate of the material gas on the substrate surface. The "competitive adsorption" refers to a phenomenon in which the material gas and the control gas compete with each other and become adsorped on the substrate surface. But under the predetermined growth condition, the control gas is only temporarily adsorbed on the substrate surface, and the control gas is not adsorbed on the substrate surface when the crystal growth process ends.

The supply of the material gas may be kept constant. Further, only the supply of the control gas which is essentially not toxic is controlled. Hence, these features are very preferable features from the point of view of the safety measures to be taken.

If no control gas is supplied when doping an impurity into the compound semiconductor crystal, the impurity material gas makes a constant interaction with the crystal surface such as adsorption, elimination and decomposition, and a constant impurity concentration is realized in the crystal. On the other hand, if the control gas is supplied, the impurity material gas and the control gas make the competitive adsorption with respect to the crystal surface. Hence, in this case, the adsorption rate of the impurity material gas decreases and the impurity concentration realized in the crystal decreases. Accordingly, by controlling the amount of control gas which is supplied, it is possible to control the adsorption rate of the impurity material gas, that is, control the impurity concentration which is realized in the crystal.

In addition, when growing a group III-V compound semiconductor mixed crystal including two kinds of group III elements, for example, two group III material gases make constant interactions with the crystal surface such as adsorption, elimination and decomposition, and a mixed crystal having a constant composition is grown because the two group III material gases are introduced in the crystal at constant rates. On the other hand, if the control gas is supplied, the two group III material gases and the control gas make the competitive adsorption with respect to the crystal surface, and the adsorption rates of the group III material gases decrease. Generally, the adsorption of one of the two group III material gases is suppressed by the control gas more strongly compared to the other. In other words, the adsorption rates of the two group III material gases do not decrease at the same rate when the control gas is supplied, and the decrease of the adsorption rate of one of the two group III material gases is considerably large compared to the other. As a result, the ratio of the two group III material gases introduced in the crystal, that is, the composition of the mixed crystal, is affected by the control gas. Hence, it is possible to control the composition of the mixed crystal by controlling the amount of control gas which is supplied.

Furthermore, when growing the compound semiconductor crystal, the material gas is introduced in the crystal at a constant rate if no control gas is supplied. In other words, the material gas is introduced in the crystal at a constant speed, and the crystal grows at a constant growth speed. On the other hand, if the control gas is supplied, the material gas and the control gas make the competitive adsorption with respect to the crystal surface, and the adsorption rate of the material gas, that is, the crystal growth speed, decreases. Accordingly, by controlling the amount of control gas which is supplied, it is possible to control the adsorption rate of the material gas, and as a result, it is possible to control the speed with which the material gas is introduced into the crystal and thus control the crystal growth speed.

Next, a description will be given of a first embodiment of the compound semiconductor crystal growing method according to the present invention.

In this embodiment, the present invention is applied to the impurity doping of the $In_xGa_{1-x}As$ mixed crystal which is grown by the atomic layer epitaxy (ALE) using alternate gas supplying method.

Triethyl gallium (TEG, $(C_2H_5)_3Ga$) and trimethyl indium (TMI, $(CH_3)_3In$) are used as the group III material gases. Arsine ($AsH_3$) is used as the group V material gas. In addition, diethyl beryllium (DEB, $(C_2H_5)_2Be$) is used as the p-type impurity doping gas, and trimethyl gallium (TMG, $(CH_3)_3Ga$) is used as the control gas.

Figure 1:
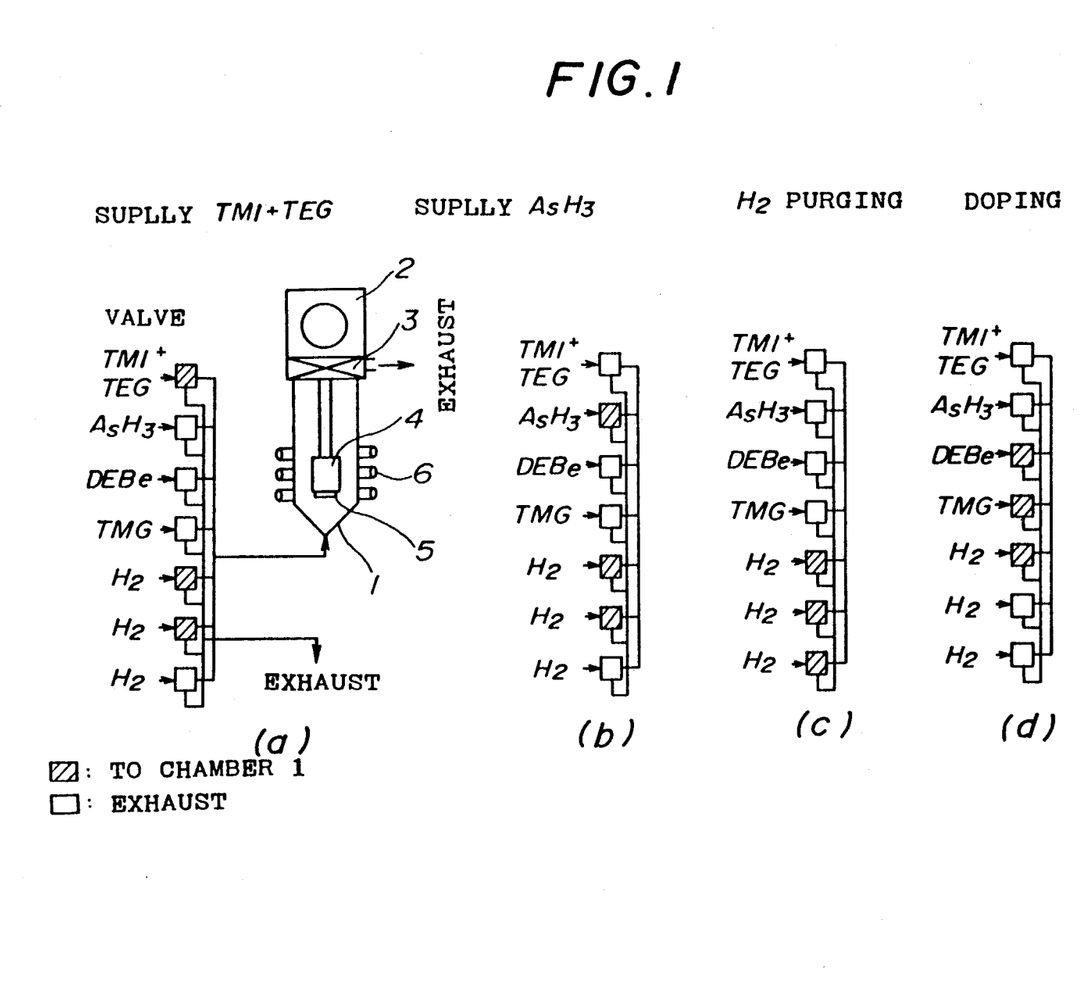
FIG.1 is a diagram for explaining a method of switching gases in a first embodiment of a compound semiconductor crystal growing method according to the present invention.

FIG.1 is a diagram for explaining the switching of the gases when supplying the material gases and the carrier gas to a growth chamber.

In FIG.1 (a), a substrate crystal 5 is placed on a susceptor 4 in an auxiliary chamber 2, and is inserted into a growth chamber (reaction chamber) 1 via a gate valve 3. The substrate temperature (growth temperature) is controlled by the high-frequency power supplied via a RF coil 6. A gas is constantly supplied to the reaction chamber 1. In other words, the selected gas is supplied to the reaction chamber 1, and the non-selected gas is exhausted as it is. The flow of the non-selected gas is not stopped in order to maintain the gas pressure, the flow rate and the like constant and to enable the gas to be supplied immediately under a predetermined condition when the gas is selected. The total amount of gas supplied to the reaction chamber 1 is always maintained constant, so that the conditions do not change. Accordingly, when changing the flow rate of the gas which is to be supplied to the reaction chamber 1, the flow rate of hydrogen ($H_2$) gas is adjusted so as to maintain the total amount of gas supplied to the reaction chamber 1 constant.

In FIG.1, the gas is supplied to the reaction chamber 1 via a valve which is indicated by a hatching, while an unhatched valve indicates that the gas is exhausted as it is without being supplied to the reaction chamber 1.

FIG.1 (a) shows a state where the TMI and TEG gases are supplied to the reaction chamber 1. On the right of FIG.1 (a), (b) shows a state where the AsH$_3$ gas is supplied to the reaction chamber 1, (c) shows a state where only the H$_2$ gas is supplied to the reaction chamber 1 for purging purposes, and (d) shows a state of the valves when doping Be.

Figure 2:
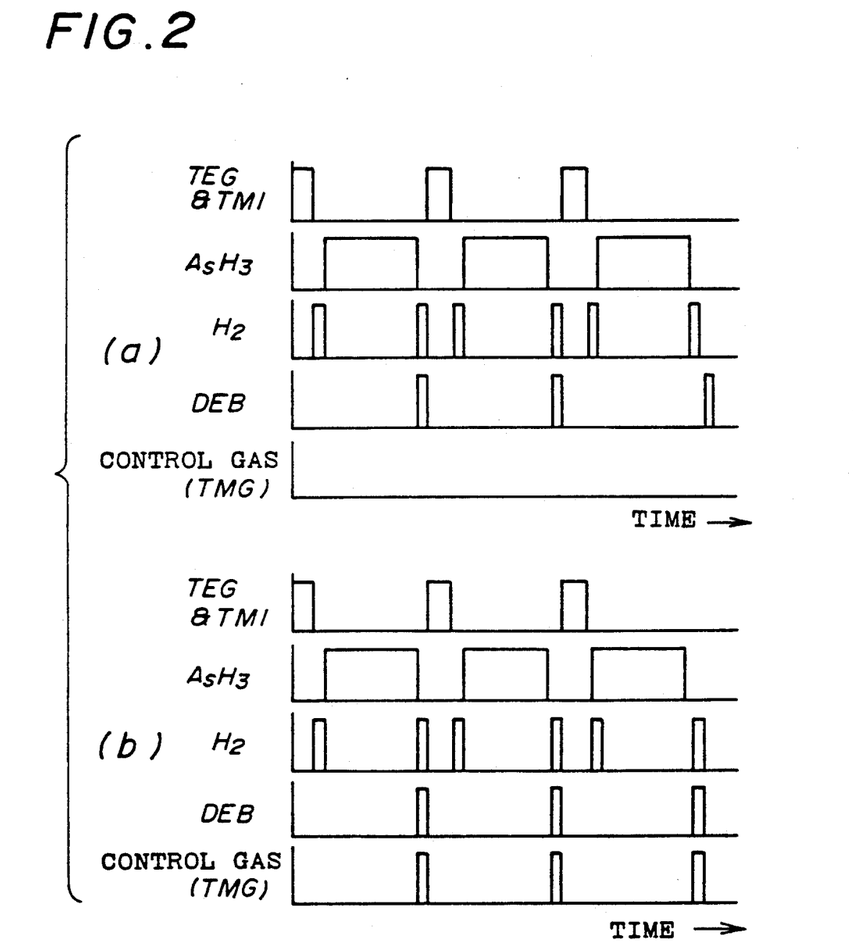
FIG.2 is a time chart for explaining the supply of material and carrier gases in FIG.1.

FIG.2 is a time chart for explaining the supply of material and carrier gases to the reaction chamber 1, where H$_2$ is used as the carrier gas. As shown, each gas is supplied intermittently and periodically, and FIG.2 shows the supply of the gases for 3 gas supplying periods. The gas supplying time of each gas during 1 gas supplying period is as follows. That is, The TEG and TMI gases may be supplied in a range of 1 to 20 seconds, and is normally set to 3 seconds. The H$_2$ gas is supplied twice during one gas supplying period, for 0.1 second or more each time. Normally, the H$_2$ gas is supplied for 1 second each time. The AsH$_3$ gas may be supplied for 1 second or more, and is normally supplied for 10 seconds.

The flow rates of the TEG and TMI gases may respectively be set in a range of 10 to 1000 sccm, but are normally set to 34 sccm. The flow rate of AsH$_3$ may be 50 sccm or more, but is normally set to 480 sccm.

The temperature of each bubbler may be set in a range of 0° to 50° C. Normally, the bubbler temperature is held to 11.0° C. for TEG, 8.4° C. for TMI, 3.0° C. for TMG, and 13.2° C. for DEB.

Figure 3:
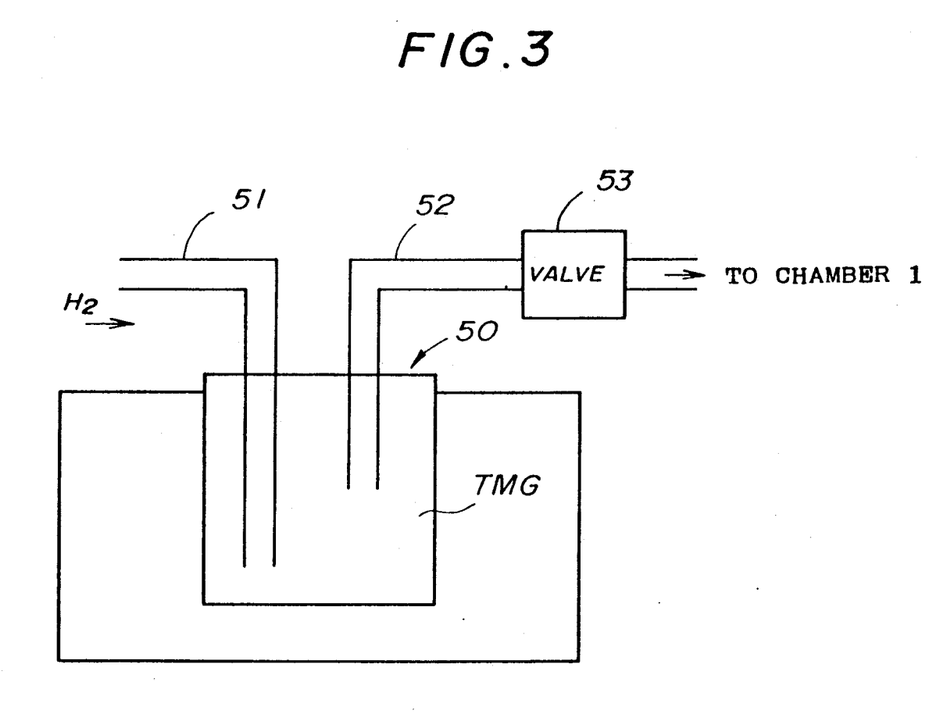
FIG.3 is a cross sectional view showing an essential part of a bubbler.

FIG.3 shows a bubbler which is provided for the TMG gas, for example. H$_2$ gas is supplied to a bubbler 50 which accommodates TMG at 3.0° C. via a pipe 51. The TMG gas is supplied to a valve 53 via a pipe 52. The valve 53 corresponds to the valve shown in FIG.1, and the TMG gas is supplied to the reaction chamber 1 when the valve 53 is opened.

The bubblers provided with respect to TEG, TMI and DEB have known constructions which are basically the same as that shown in FIG.3, and illustration and description thereof will be omitted.

The substrate crystal 5 in this embodiment is made of InP. Normally, the (100) face of the substrate is used, but it is of course possible to use other crystal faces. The growth temperature is set to 350° C. Because the decomposition of TMG occurs at a temperature of approximately 450° C., the TMG gas which is used as the control gas will not decompose at the growth temperature of 350° C.

FIG.2 (a) shows a case where the TMG control gas is not supplied to the reaction chamber 1, and FIG.2 (b) shows a case where the TMG control gas is supplied to the reaction chamber 1.

In FIG.2 (a), the DEB gas makes a constant interaction with the crystal surface such as adsorption, elimination and decomposition, and a constant impurity concentration is realized in the crystal. In this embodiment, the impurity concentration of Be in this case is approximately $8 \times 10^{19}$ cm$^{-3}$.

On the other hand, in FIG.2 (b), the DEB control gas is supplied to the reaction chamber 1, and the DEB gas and the TMG control gas make the competitive adsorption with respect to the crystal surface. Hence, in this case, the adsorption rate of the DEB gas decreases and the impurity concentration realized in the crystal decreases. In this embodiment, the impurity concentration of Be in this case is approximately $4 \times 10^{19}$ cm$^{-3}$.

Figure 4:
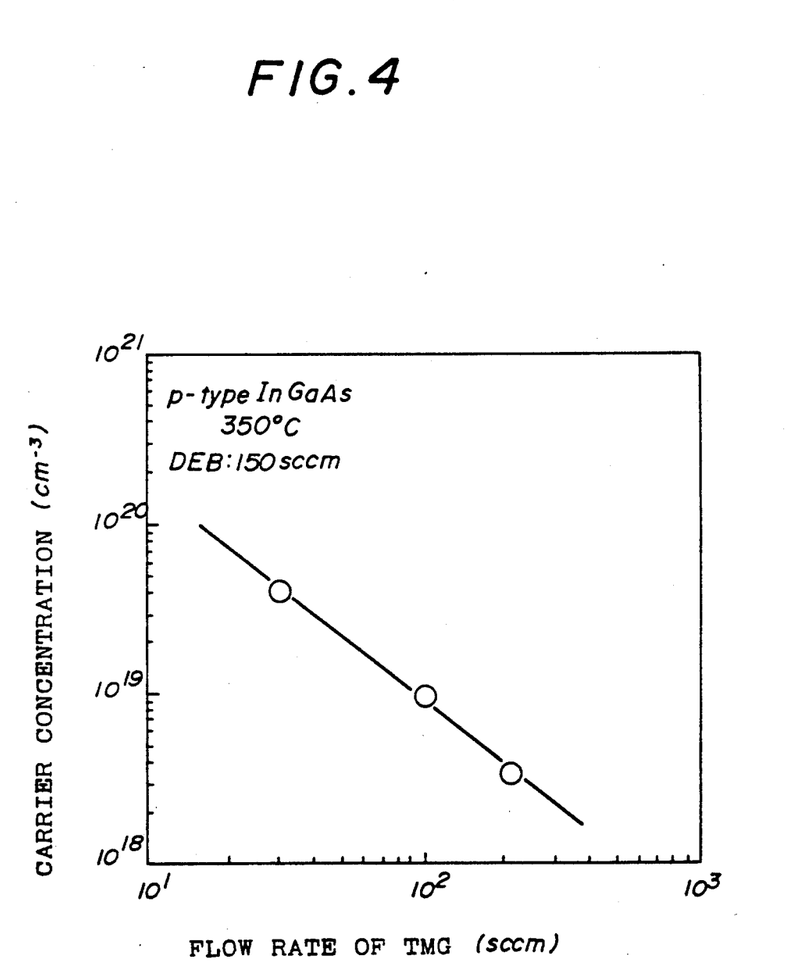
FIG.4 shows a relationship between the carrier concentration of $In_xGa_{1-x}As$ and the flow rate of TMG in a second embodiment of the compound semiconductor crystal growing method according to the present invention.

FIG.4 shows the relationship between the carrier concentration of the In$_x$Ga$_{1-x}$As and the flow rate of the TMG gas for a case where the flow rate of the DEB gas is kept constant and the amount of the TMG gas supplied to the reaction chamber 1 is increased from 30 to 250 sccm. In this case, x is selected so that the InGaAs makes a lattice matching to the InP substrate.

The TMG gas makes the competitive adsorption with the DEB gas without becoming decomposed. However, the TMG gas is adsorbed on the crystal surface for only an extremely short period of time, and the adsorption and elimination are repeated within a short time. For this reason, when the supply of the DEB gas and the TMG gas to the reaction chamber 1 is stopped and the supply of the TEG gas and the TMI gas to the reaction chamber 1 is resumed, the TMG gas supplied to the crystal surface is already eliminated in its entirety.

Next, a description will be given of a second embodiment of the compound semiconductor crystal growing method according to the present invention.

In this embodiment, the present invention is applied to the In composition (x value) control of the mixed crystal when growing the In$_x$Ga$_{1-x}$As mixed crystal by the ALE. In addition, the control gas in this embodiment is supplied simultaneously to the reaction chamber 1 as the group III material gases.

The substrate crystal 5 in this embodiment is made of InP. Normally, the (100) face of the substrate is used, but it is of course possible to use other crystal faces. The growth temperature is set to 350° C. Because the decomposition of TMG occurs at a temperature of approximately 450° C., the TMG gas which is used as the control gas will not decompose at the growth temperature of 350° C.

In this embodiment, no DEB gas is supplied to the reaction chamber 1. However, the supply of other gases is basically the same as that of the first embodiment shown in FIG.2. The flow rate of each gas and each bubbler temperature are also the same as those of the first embodiment.

Of course, an impurity element material gas such as the DEB gas may be supplied to the reaction chamber 1 if necessary, similarly as in the case of the first embodiment.

Figure 5:
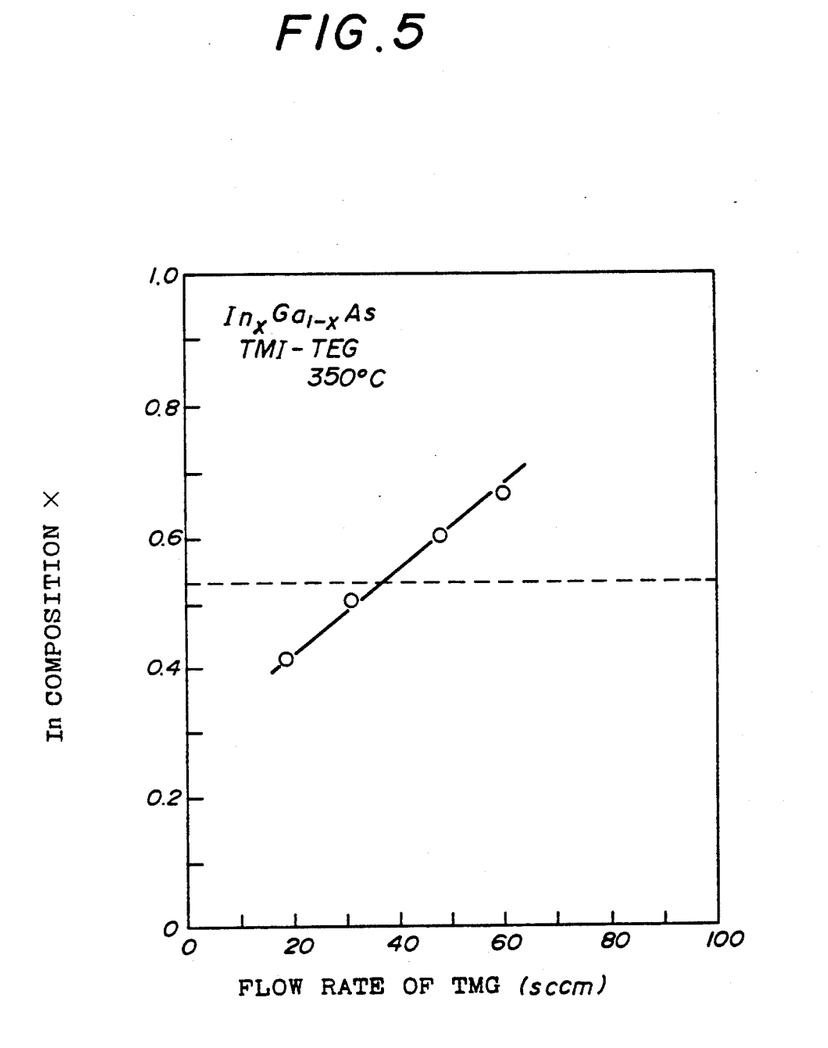
FIG.5 shows a relationship between the In composition and the flow rate of TMG in the second embodiment.

When the amount of TMG control gas supplied to the reaction chamber 1 is changed in a range of 20 to 70 sccm and the x value is measured for the In$_x$Ga$_{1-x}$As mixed crystals which are grown for each flow rate of the TMG control gas, the relationship between the In composition and the flow rate of the TMG control gas becomes as shown in FIG.5. In FIG.5, a dotted line indicates the x value for the case where the InGaAs makes the lattice matching with the InP substrate. As may be seen from FIG.5, the x value increases from approximately 0.4 to 0.7 when the flow rate of the TMG control gas increases from 20 to 70 sccm.

Even when controlling the carrier concentration as in the case of the first embodiment, there is a slight change in the x value when the crystal is grown by simultaneously supplying the impurity gas and the material gas to the reaction chamber 1. Hence, the flow rates of the TEG gas and the TMI gas must be adjusted if it is necessary to prevent such a change in composition.

In the second embodiment, the composition of In$_x$Ga$_{1-x}$As, that is, a 3-element mixed crystal, is controlled. However, it is of course possible to similarly control the composition of mixed crystals having 4 or more elements.

In addition, although the second embodiment is applied to In$_x$Ga$_{1-x}$As which is a 3-element mixed crystal, it is possible to apply the present invention to 2-element mixed crystals such as GaAs and InAs. In other words, it is possible to control the crystal growth speed by supplying one of the material gases to the reaction chamber 1 together with the control gas.

Furthermore, although the first and second embodiments described above employ the ALE, the present invention is similarly applicable to other crystal growing methods such as metal organic vapor phase epitaxy (MOVPE), gas source molecular beam epitaxy, and halide or chloride CVD.

Next, a description will be given of the effects of the present invention, by referring to FIG.6.

If the flow rate of H$_2$Se which is used as the impurity element material gas is controlled to 1, 2 and 3 sccm by use of the mass flow controller according to the conventional method, the carrier concentration of In$_x$Ga$_{1-x}$As changes as indicated by white circles, due to the poor accuracy of the mass flow controller. As described above, the accuracy of the mass flow controller is poor when measuring very small flow rates. Hence, the carrier concentration of In$_x$Ga$_{1-x}$As does not change linearly according to the conventional method.

Figure 6:
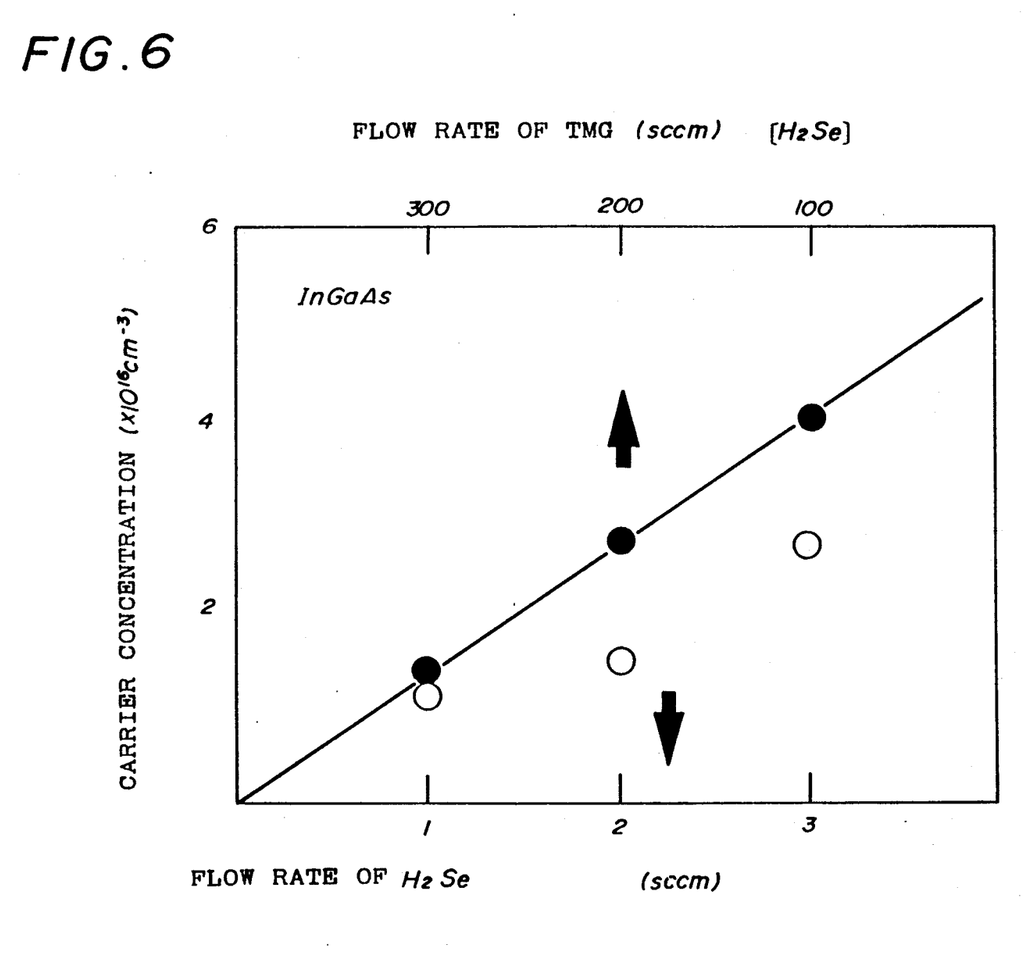
FIG.6 is a diagram for explaining the effects of the present invention.

On the other hand, if the flow rate of H$_2$Se is maintained constant similarly to the first embodiment and the flow rate of the TMG control gas is controlled to 300, 200 and 100 sccm, the carrier concentration of In$_x$Ga$_{1-x}$As changes linearly as indicated by black circles in FIG.6. Therefore, it may be seen that the present invention enables accurate control of the amount of impurity element material gas into the crystal even if the amount of impurity element material gas is very small.

The present invention is particularly effective when making elements in which the multi-layered hetero structure has different compositions or impurity concentrations, such as the heterojunction bipolar transistor (HBT) and the high electron mobility transistor (HEMT). The present invention is effective in such applications because it is unnecessary to change the amount of material gas to be supplied to the reaction chamber 1 every time the composition or impurity concentration of the multi-layered structure changes.

Figure 7:
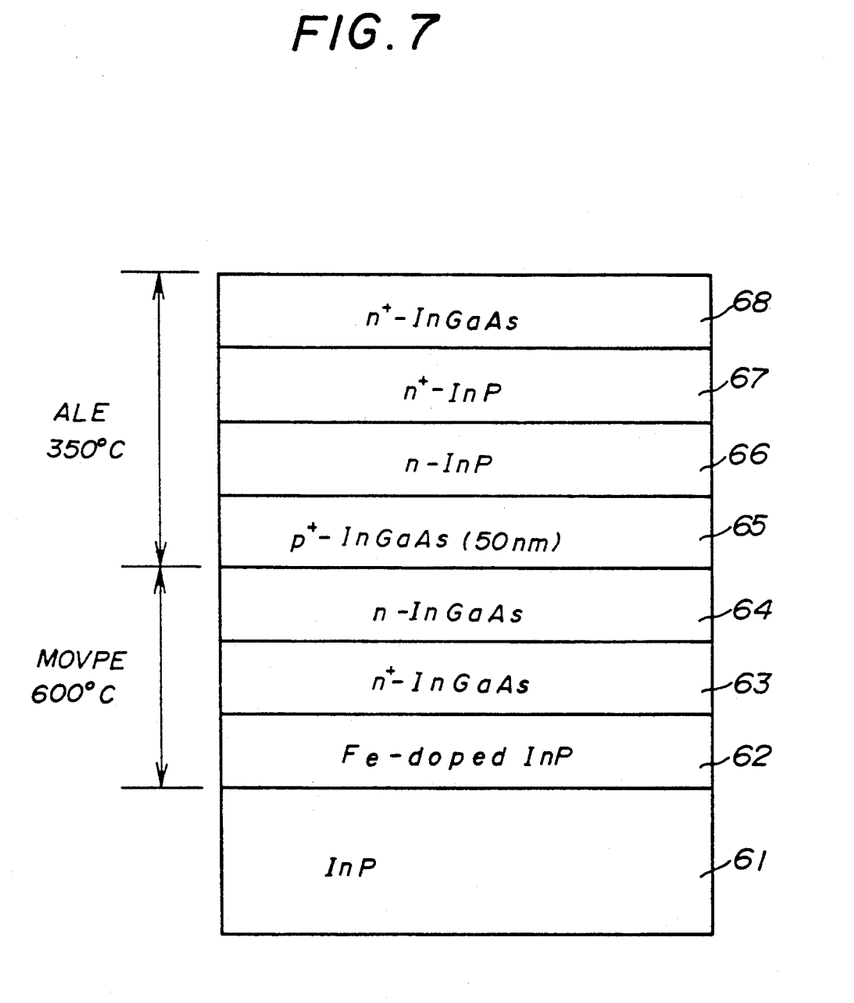
FIG.7 is a cross sectional view showing an essential part of a HBT, for explaining the effects of the present invention.

FIG.7 shows a cross section of an essential part of a HBT having an InP/InGaAs junction. In FIG.7, the HBT includes an InP substrate 61, a Fe-doped InP buffer layer 62, an n$^+$-type InGaAs collector contact layer 63, an n-type InGaAs collector layer 64, a p$^+$-type InGaAs base layer 65, an n-type InP emitter layer 66, an n$^+$-type InP first cap layer 67, and an n$^+$-type InGaAs second cap layer 68. For example, the layers 62 through 64 are grown by the MOVPE at 600° C., and the layers 65 through 68 are grown by the ALE at 350° C. The p$^+$-type InGaAs base layer 65 is doped with Be at a high impurity density.

When the conventional method is employed and the impurity concentration of the impurity element Be is set to $1\times10^{19}$, $4\times10^{19}$ and $8\times10^{19}$ cm$^{-3}$ using no control gas, the x-ray peak positions (2θ) for these impurity concentrations respectively were 63.15°, 63.23° and 63.33° when the x-ray peak positions were measured to study the composition of the p$^+$-type InGaAs base layer 65. It was thus confirmed that the composition of InGaAs slightly changed according to the conventional method.

On the other hand, when the flow rate of the material gases are kept constant and the flow rate of the TMG control gas was controlled to 200, 100 and 0 sccm similarly to the second embodiment in order to obtain the Be concentrations of $1\times10^{19}$, $4\times10^{19}$ and $8\times10^{19}$ cm$^{-3}$ which are the same as the above, the measured x-ray peak positions for these Be concentrations respectively were 63.32°, 63.34° and 63.33°. As a result, it was confirmed that the composition of InGaAs remains virtually unchanged and that the composition of the mixed crystal can be controlled by use of the control gas, even if the impurity concentration is relatively high.

Further, the present invention is not limited to these embodiments, but various variations and modifications may be made without departing from the scope of the present invention.

What is claimed is:

1. A compound semiconductor crystal growth method comprising the steps of:
   supporting a substrate having a growth surface in a reaction chamber;
   supplying to the chamber a material gas of a compound semiconductor which is to be grown in the form of a crystal on the growth surface;
   supplying a control gas to the chamber under conditions such that the control gas undergoes competitive adsorption with the material gas on the growth surface but does not undergo chemical reaction sufficient to cause accumulation on said growth surface; and
   controlling the rate of supply of said control gas to said chamber to thereby control the competitive adsorption mechanism and thus control the rate at which said compound semiconductor is adsorbed onto said growth surface.

2. A method as set forth in claim 1, wherein said material gas is supplied to the chamber at a constant rate.

3. A method as set forth in claim 1, wherein at least one of said material gas and said control gas is supplied intermittently and periodically to said chamber.

4. A method as set forth in claim 1, wherein said material gas and said control gas are supplied to the reaction chamber simultaneously.

5. A method as set forth in claim 1, wherein said control gas supply rate is controlled such that at least three different compound semiconductor compositions are grown on said growth surface.

6. A method as set forth in claim 1, wherein the control gas supply rate is controlled so as to control the growth speed of the compound semiconductor being formed on said growth surface.

7. A method as set forth in claim 1, wherein the material gas comprises one or more Group III element gases and a Group V element gas and said control gas comprises a gas which undergoes competitive adsorption with one of said Group III gases or said Group V element gas.

8. A method as set forth in claim 7, wherein said material gas comprises triethyl gallium and trimethyl indium as the Group III element gases and arsine as the Group V element gas and said control gas comprises trimethyl gallium.

9. A method as set forth in claim 8, wherein said material gas further comprises diethyl beryllium.

10. A method as set forth in claim 1, wherein said material gas is supplied to said chamber at a constant rate and said control gas is supplied to said chamber intermittently and periodically.

11. A method as set forth in claim 10, wherein said control gas supply rate is controlled such that at least three different compound semiconductor compositions are grown on said growth surface.

12. A method as set forth in claim 10, wherein the control gas supply rate is controlled so as to control the growth speed of the compound semiconductor being formed on said growth surface.

13. A method as set forth in claim 10, wherein the material gas comprises one or more Group III element gases and a Group V element gas and said control gas comprises a gas which undergoes competitive adsorption with one of said Group III element gases or said Group V element gas.

14. A method as set forth in claim 1, wherein said compound semiconductor growth is carried out using atomic layer epitaxy, metal organic vapor phase epitaxy, gas source molecular beam epitaxy or halide chemical vapor deposition procedures.

15. A method as set forth in claim 1, wherein is included the step of supplying a carrier gas to said chamber at a rate such that the total flow rate of all the gases supplied to the chamber is constant.

* * * * *